(12) United States Patent
Jung

(10) Patent No.: US 8,817,560 B2
(45) Date of Patent: Aug. 26, 2014

(54) SEMICONDUCTOR MEMORY DEVICE HAVING REDUNDANT FUSE CIRCUIT

(75) Inventor: Jeongsu Jung, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 150 days.

(21) Appl. No.: 13/494,782

(22) Filed: Jun. 12, 2012

(65) Prior Publication Data

US 2013/0329509 A1 Dec. 12, 2013

(51) Int. Cl.
*G11C 29/00* (2006.01)
*G11C 17/18* (2006.01)
*G11C 8/00* (2006.01)

(52) U.S. Cl.
USPC .................... 365/200; 365/225.7; 365/230.03

(58) Field of Classification Search
USPC .................................. 365/200, 225.7, 230.03
See application file for complete search history.

(56) References Cited

U.S. PATENT DOCUMENTS

| | | | | |
|---|---|---|---|---|
| 5,859,801 A | * | 1/1999 | Poechmueller | 365/200 |
| 6,373,772 B2 | * | 4/2002 | Kato et al. | 365/225.7 |
| 7,321,949 B2 | * | 1/2008 | An | 365/230.03 |
| 7,911,872 B2 | * | 3/2011 | Lakhani et al. | 365/225.7 |

* cited by examiner

*Primary Examiner* — Trong Phan
(74) *Attorney, Agent, or Firm* — IP & T Group LLP

(57) ABSTRACT

A semiconductor memory device includes: a memory cell array configured to include a redundant cell array; a column selection line driver configured to select and drive a column of the redundant cell array and a column of the memory cell array; a plurality of unit redundant fuse circuits each configured to include a fuse and a fuse latch; a comparison logic array configured to include comparison logics that respectively correspond to the unit redundant fuse circuits; and a global address line set configured to transfer a column address to the comparison logic array.

6 Claims, 3 Drawing Sheets

SEMICONDUCTOR MEMORY DEVICE HAVING REDUNDANT FUSE CIRCUIT

BACKGROUND

1. Field

Exemplary embodiments of the present invention relate to a technology for designing a semiconductor integrated circuit, and more particularly, to a redundant fuse circuit of a semiconductor memory device.

2. Description of the Related Art

A semiconductor integrated circuit includes a lot of circuits having the same pattern, and it includes a redundancy circuit for making up for a failure so that the semiconductor integrated circuit may be used as a normal product although it includes a circuit having failure according to procedural variable.

In particular, one memory chip includes a great deal of memory cells integrated therein. If there is any one memory cell including a failure among the memory cells, the memory chip is regarded as a defective chip and abandoned.

As more and more memory cells are integrated in a chip of a limited dimensions along the industrial tendency of high integration of a semiconductor integrated circuit, even one failure in any one cell makes the memory chip a defective chip and. In this case, the number of memory chips to be abandoned will increase and thus economical efficiency in the production of a semiconductor memory device is deteriorated.

To overcome the problem, a typical semiconductor memory device includes a fuse circuit and a redundant cell array. The fuse circuit includes a plurality of fuses that are formed of a metallic material. The fuse circuit substitutes a failure cell with a redundant cell during a repair process according to whether a fuse is blown or not. The redundant cell array and the fuse circuit are fabricated during a semiconductor device fabrication process. During a repair process, the redundant cell array and the fuse circuit substitutes a failure memory cell, which is decided having a failure, with a redundant cell, and the repair process is performed in such a manner that a fuse formed of a metallic material is cut off with a laser beam.

FIG. 1 illustrates an arrangement of a core region of a typical semiconductor memory device.

Referring to FIG. 1, the semiconductor memory device includes a cell array 100 where a plurality of memory cells that are selected based on a row address and a column address are regularly arrayed. Also, the semiconductor memory device includes a column selection line driver 110 for selecting and driving a column, which is a bit line, corresponding to the column address. Also, a word line driver for selecting and driving a row, which is a word line, is required but the part of columns will be described, herein.

As described before, the cell array 100 of the semiconductor memory device includes a redundant cell array for substituting a failure cell with a redundant cell. To be specific, a column redundant circuit 120 for programming the column information of a failure cell and, when the corresponding column address is inputted, substituting a failure column with a redundant column is disposed under the cell array 100 and the column selection line driver 110.

The column redundancy circuit 120 includes an array formed of a plurality of unit redundant fuse circuits. Each of the unit redundant fuse circuits includes a fuse 122, a fuse latch 124, and comparison logic 126. The fuse 122 programs the column address of a failure cell. The fuse latch 124 senses and stores the blowing state of the fuse 122. The comparison logic 126 compares the output signal of the fuse latch 124 with a column address CA<0:n> applied at present.

Herein, since the fuse 122, the fuse latch 124, and the comparison logic 126 are widely known typical circuit blocks, their internal circuits are not described.

If any, since the comparison logic 126 requires the input of the column address CA<0:n> applied at present, global lines for transferring the column address CA<0:n> to the comparison logic 126 need to be arrayed. FIG. 1 shows a case where four global address line sets are arrayed. Each global address line set includes global line addresses as many as the number (n+1) of bits of the column address CA<0:n>, the total number of global address lines is great.

Therefore, a global address line driver 130 for driving the global address lines drives a great deal of loading. When it is assumed that the loading for one global address line set is referred to as 'Cr', the loading that the global address line driver 130 has to drive reaches approximately '4Cr'. Such a great load negatively affects the high-speed operation of a semiconductor memory device.

Meanwhile, as mentioned above, since there are many global address lines, there is a problem in that the size of a chip for routing the global address lines is great.

As a semiconductor integrated circuit is integrated higher and higher, more redundant column lines are needed. Accordingly, the number of needed global address lines is increased as many as the number of the redundant column lines. Therefore, the loading problem from the global address lines and the chip size problem are expected to become more serious.

SUMMARY

An embodiment of the present invention is directed to a semiconductor memory device that may have a decreased number of global address lines for applying a column address to a column redundant fuse circuit.

In accordance with an embodiment of the present invention, a semiconductor memory device includes: a memory cell array configured to include a redundant cell array; a column selection line driver configured to select and drive a column of the redundant cell array and a column of the memory cell array; a plurality of unit redundant fuse circuits each configured to include a fuse and a fuse latch; a comparison logic array configured to include comparison logics that respectively correspond to the unit redundant fuse circuits; and a global address line set configured to transfer a column address to the comparison logic array.

In accordance with another embodiment of the present invention, a semiconductor memory device includes: a memory cell array configured to include a redundant cell array; a column selection line driver configured to select and drive a column of the redundant cell array and a column of the memory cell array; a first unit redundant fuse circuit array configured to include a plurality of first unit redundant fuse circuits each provided with a fuse and a fuse latch; a first comparison logic array configured to include first comparison logics that respectively correspond to the first unit redundant fuse circuits; a second unit redundant fuse circuit array configured to include a plurality of second unit redundant fuse circuits each provided with a fuse and a fuse latch; a second comparison logic array configured to include second comparison logics that respectively correspond to the second unit redundant fuse circuits; a first global address line set configured to transfer a column address to the first comparison logic array; and a second global address line set configured to transfer a column address to the second comparison logic array.

DETAILED DESCRIPTION

Figure 1:
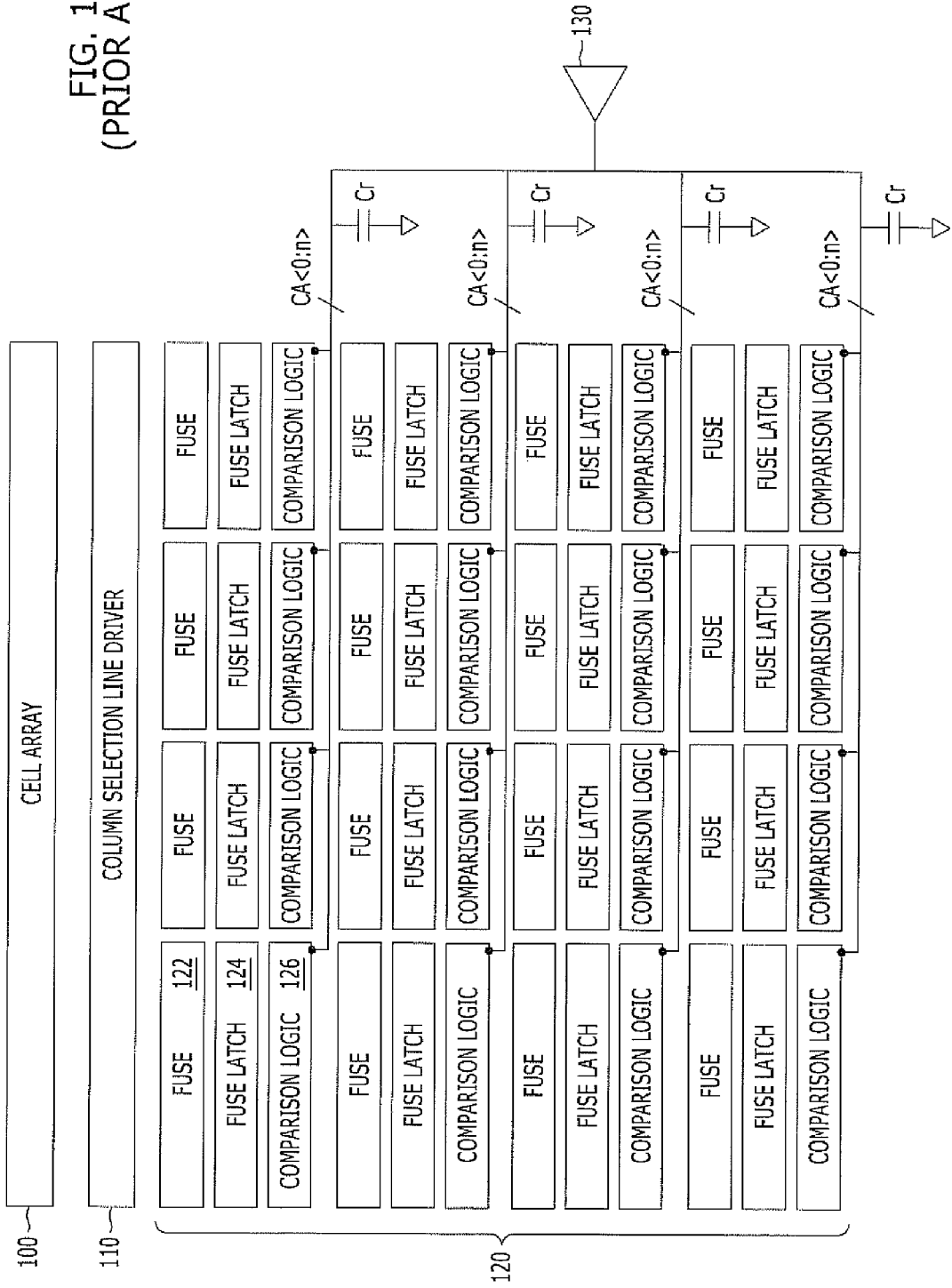
FIG. 1 illustrates an arrangement of a core region of a typical semiconductor memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
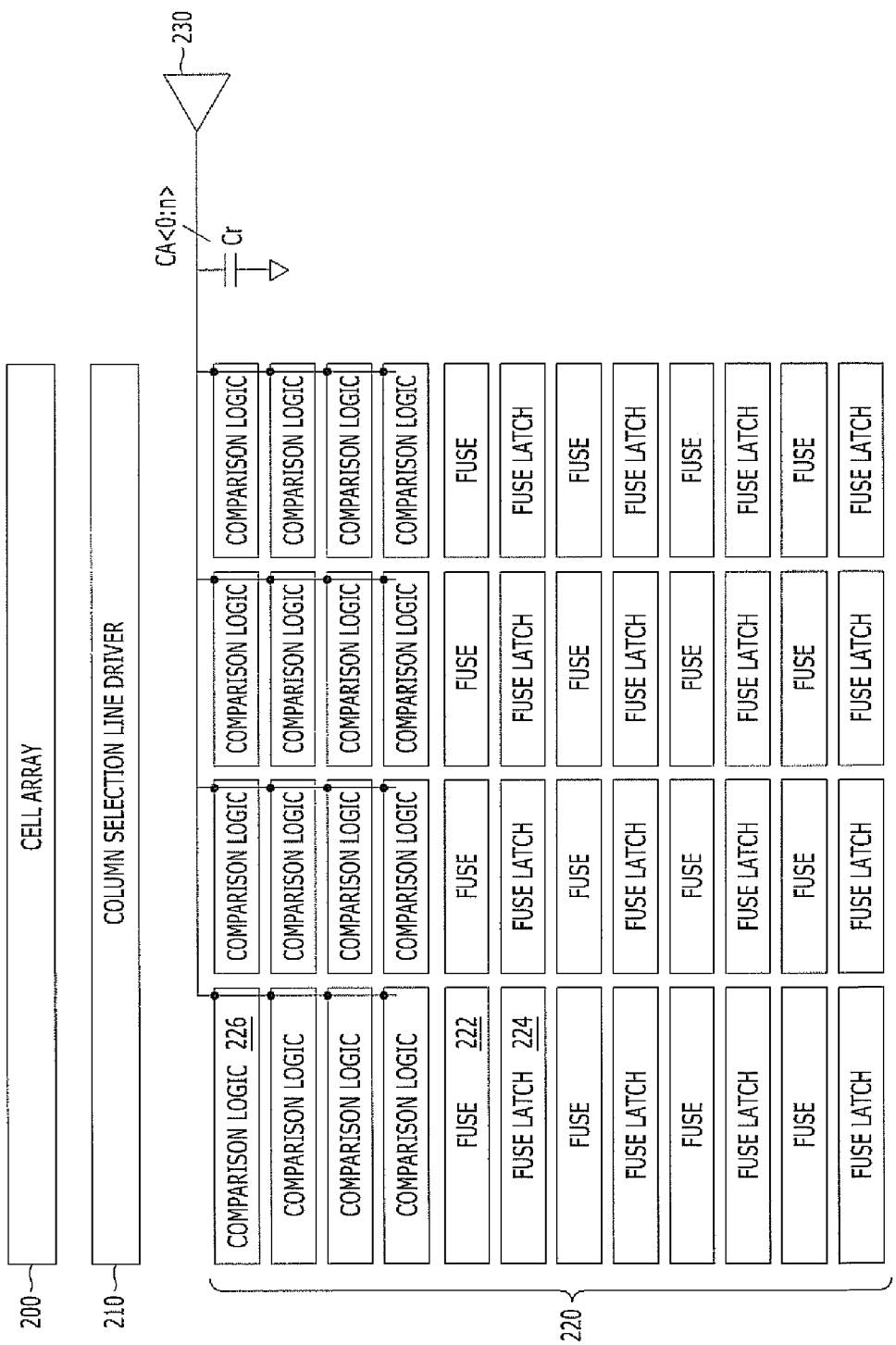
FIG. 2 illustrates an arrangement of a core region of a semiconductor memory device in accordance with an embodiment of the present invention.

FIG. 2 illustrates an arrangement of a core region of a semiconductor memory device in accordance with an embodiment of the present invention.

Referring to FIG. 2, the semiconductor memory device in accordance with the embodiment of the present invention includes a cell array 200, a column selection line driver 210, a column redundancy circuit 220, and a global address line driver 230. The cell array 200 includes a plurality of memory cells that are selected based on a row address and a column address are regularly arrayed. The column selection line driver 210 selects and drives a column, which is a bit line, corresponding to the column address. The column redundancy circuit 220 programs the column information of a failure cell, which is a cell with a failure occurring therein, and when the column address of the failure cell is inputted, the column redundancy circuit 220 substitutes a failure column including the failure cell with a redundant column. The global address line driver 230 drives a global address line for transferring the column address to the column redundancy circuit 220.

Hereafter, the arrangement of the column redundancy circuit 220 is described in detail.

The column redundancy circuit 220 includes a plurality of unit redundant fuse circuits. Each of the unit redundant fuse circuits includes a fuse 222, a fuse latch 224, and a comparison logic 226. The fuse 222 programs the column address of a failure cell. The fuse latch 224 senses and stores the blowing state of the fuse 222. The comparison logic 226 compares the output signal of the fuse latch 224 with a column address CA<0:n> that is applied at present.

According to the embodiment of the present invention, the comparison logics 226 that constitute the column redundancy circuit 220 are collected and disposed in one location regardless of a unit redundant fuse circuit. The comparison logic array may be disposed at any region of the column redundancy circuit 220, but it is preferred to dispose the comparison logic array close to the column selection line driver 210. In other words, the comparison logic array is disposed first under the column selection line driver 210, and then the fuse 222 and the fuse latch 224 are disposed under the comparison logic array for each unit circuit.

When the comparison logics 226 are collectively disposed in one place regardless of the unit redundant fuse circuit, the number of global address line sets for transferring column addresses may be decreased from 4 sets to one set.

Therefore, when compared with that of FIG. 1, the amount of load that the global address line driver 230 has to drive is decreased from '4Cr' to 'Cr'. Since RC delay is decreased as much as the decreased load, the delay in the global address lines is reduced remarkably and thus there is little difficulty in supporting a high-speed operation.

Also, the size of a chip for routing them may be remarkably decreased as much as the global address lines are decreased, it is possible to shrink the chip size.

Meanwhile, as described before, as a semiconductor integrated circuit is integrated higher and higher, more redundant column lines are needed. Accordingly, the number of needed global address lines is increased as many as the number of the redundant column lines. Therefore, the effect of decreasing the number of global address lines and the effect of reducing a chip size may outstand more and more.

Figure 3:
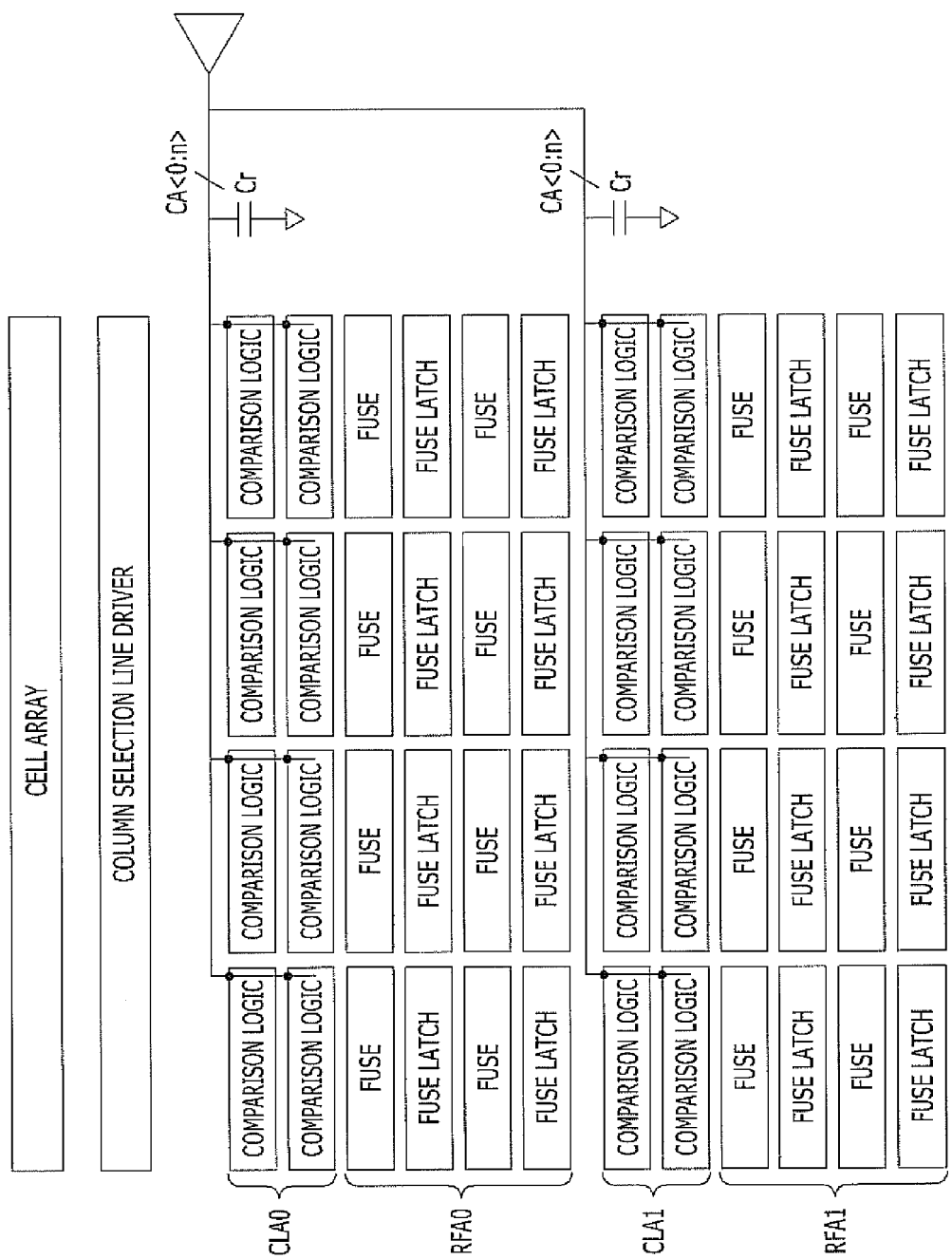
FIG. 3 illustrates an arrangement of a core region of a semiconductor memory device in accordance with another embodiment of the present invention.

FIG. 3 illustrates an arrangement of a core region of a semiconductor memory device in accordance with another embodiment of the present invention.

Referring to FIG. 3, the semiconductor memory device in accordance with another embodiment of the present invention is different from the semiconductor memory device in accordance with the previous embodiment of the present invention in that the comparison logic array is not disposed in one region but disposed in two different regions.

To be specific, a first comparison logic array CLA0 is disposed under a column selection line driver, and a first unit redundant fuse circuit array RFA0 including a fuse and a fuse latch is disposed under the first comparison logic array CLA0. A second comparison logic array CLA1 is disposed under the first unit redundant fuse circuit array RFA0, and then a second unit redundant fuse circuit array RFA1 including a fuse and a fuse latch is disposed under the second comparison logic array CLA1.

As described above, when the comparison logic array is disposed not in one region but in two regions, the number of the global address line sets is increased into two. This is disadvantageous in terms of line loading and the size of a routing area, but enhanced connection with the unit redundant fuse circuit array may be expected. Of course, the line loading of the global address lines and the routing area may be reduced by half, compared with the conventional technology illustrated in FIG. 1.

According to an embodiment of the present invention, the number of global address lines for transferring a column address to a column redundant fuse circuit may be decreased by collectively arraying comparison logics that are in need of a column address to be inputted in the column redundant fuse circuit. Accordingly, the line load of global address lines may be reduced and the increase in the circuit area may be suppressed.

While the present invention has been described with respect to the specific embodiments, it will be apparent to those skilled in the art that various changes and modifications may be made without departing from the spirit and scope of the invention as defined in the following claims.

For example, although a case where comparison logics are collectively disposed in one or two regions is described in the above embodiment, the comparison logics may be collectively disposed in more than two regions, if necessary, and the disposed positions may be changed as well.

What is claimed is:

1. A semiconductor memory device, comprising:
a memory cell array configured to include a redundant cell array;
a column selection line driver configured to select and drive a column of the redundant cell array and a column of the memory cell array;
a plurality of unit redundant fuse circuits each including a fuse and a fuse latch;
a unit comparison logic array including comparison logics that respectively correspond to the unit redundant fuse circuits; and
a global address line set configured to transfer a column address to the unit comparison logic array in which the comparison logics are arrayed with columns and rows.

2. The semiconductor memory device of claim 1, wherein the unit comparison logic array is disposed closer to the column selection line driver than the unit redundant fuse circuits.

3. The semiconductor memory device of claim 1, further comprising:
a global address line driver configured to drive the global address line set.

4. A semiconductor memory device, comprising:
a memory cell array including a redundant cell array;
a column selection line driver configured to select and drive a column of the redundant cell array and a column of the memory cell array;
a first unit redundant fuse circuit array including a plurality of first unit redundant fuse circuits each provided with a fuse and a fuse latch;
a first unit comparison logic array including first comparison logics that respectively correspond to the first unit redundant fuse circuits;
a second unit redundant fuse circuit array including a plurality of second unit redundant fuse circuits each provided with a fuse and a fuse latch;
a second unit comparison logic array including second comparison logics that respectively correspond to the second unit redundant fuse circuits;
a first global address line set configured to transfer a column address to the first unit comparison logic array in which the first comparison logics are arrayed with columns and rows; and
a second global address line set configured to transfer a column address to the second unit comparison logic array in which the second comparison logics are arrayed with columns and rows.

5. The semiconductor memory device of claim 4, wherein the first and second unit comparison logic arrays are disposed closer to the column selection line driver than the first and second unit redundant fuse circuits, respectively.

6. The semiconductor memory device of claim 4, further comprising:
a global address line driver configured to drive the first and second global address line sets.

* * * * *